(12) United States Patent
Jang et al.

(10) Patent No.: US 9,236,108 B1
(45) Date of Patent: Jan. 12, 2016

(54) SEMICONDUCTOR MEMORY APPARATUS

(71) Applicant: SK hynix Inc., Icheon-si Gyeonggi-do (KR)

(72) Inventors: Soo Young Jang, Icheon-si (KR); Hyun Woo Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/526,082

(22) Filed: Oct. 28, 2014

(30) Foreign Application Priority Data

Jul. 8, 2014 (KR) .......................... 10-2014-0085226

(51) Int. Cl.
*G11C 7/10* (2006.01)
*G11C 11/406* (2006.01)
*G11C 11/4063* (2006.01)

(52) U.S. Cl.
CPC .......... *G11C 11/406* (2013.01); *G11C 11/4063* (2013.01)

(58) Field of Classification Search
CPC .. G11C 7/1006; G11C 7/1051; G11C 11/406; G11C 11/40615
USPC ..................................... 365/189.02, 222, 203
See application file for complete search history.

(56) References Cited

U.S. PATENT DOCUMENTS 6,587,389 B2 * 7/2003 De Paor ............... G11C 7/1018
365/222
7,145,820 B2 * 12/2006 Kwack ................. G11C 11/406
365/203

FOREIGN PATENT DOCUMENTS

KR 1020070036631 A 4/2007
KR 1020090026652 A 3/2009

* cited by examiner

*Primary Examiner* — Huan Hoang
(74) *Attorney, Agent, or Firm* — William Park & Associates Ltd.

(57) ABSTRACT

A semiconductor memory apparatus may include a row address control block configured to output an address as a row address or output a counted signal as the row address in response to a refresh signal and the address, and generate an auto-precharge signal and a pre-bank active signal in response to the refresh signal and a bank active signal. The semiconductor memory apparatus may include a bank control block configured to generate the bank active signal in response to an active signal, a precharge signal, a bank address signal, the auto-precharge signal and the pre-bank active signal.

18 Claims, 5 Drawing Sheets

SEMICONDUCTOR MEMORY APPARATUS

CROSS-REFERENCES TO RELATED APPLICATION

The present application claims priority under 35 U.S.C. §119(a) to Korean application number 10-2014-0085226, filed on Jul. 8, 2014, in the Korean Intellectual Property Office, which is incorporated herein by reference in its entirety.

BACKGROUND

1. Technical Field

Various embodiments generally relate to a semiconductor integrated circuit, and more particularly, to a semiconductor memory apparatus.

2. Related Art

Semiconductor memory apparatuses are configured to store data and output stored data.

Semiconductor memory apparatuses may be classified into two categories. One category may include nonvolatile semiconductor memory apparatuses and the other may include volatile semiconductor memory apparatuses. The volatile semiconductor memory apparatuses perform a refresh operation to retain stored data.

In the volatile semiconductor memory apparatus, developments have continuously been made to improve the refresh operation.

SUMMARY

In an embodiment, a semiconductor memory apparatus may include a row address control block configured to output an address as a row address or output a counted signal as the row address in response to a refresh signal and the address, and generate an auto-precharge signal and a pre-bank active signal in response to the refresh signal and a bank active signal. The semiconductor memory apparatus may include a bank control block configured to generate the bank active signal in response to an active signal, a precharge signal, a bank address signal, the auto-precharge signal and the pre-bank active signal.

In an embodiment, a semiconductor memory apparatus may include a row address control block configured to generate a row address, an auto-precharge signal and a pre-bank active signal in response to a refresh signal, an address and a bank active signal. The semiconductor memory apparatus may include a bank control block configured to generate the bank active signal in response to an active signal, a precharge signal, a bank address, the auto-precharge signal and the pre-bank active signal. The semiconductor memory apparatus may include a data storage region configured to be activated or perform a refresh operation in response to the row address and the bank active signal, wherein a precharge operation is performed in response to the auto-precharge signal when the refresh signal is enabled, the refresh operation is performed in response to the pre-bank active signal and the refresh signal after the precharge operation is performed, and recovery to a state before the refresh operation is made after the refresh operation is performed.

DETAILED DESCRIPTION

Hereinafter, a semiconductor memory apparatus will be described below with reference to the accompanying drawings through various examples of embodiments.

Figure 1:
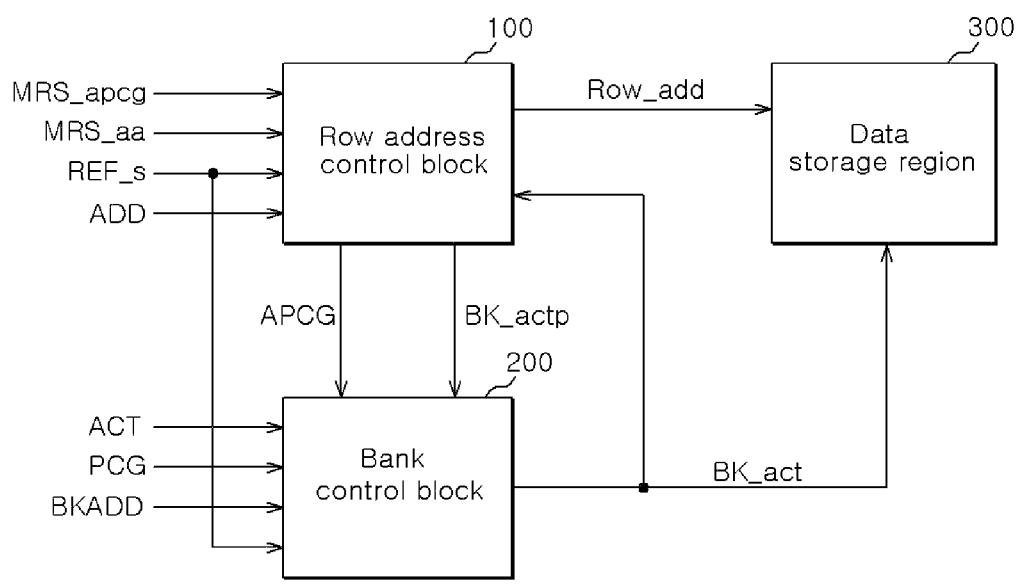
FIG. 1 is a configuration diagram illustrating a representation of an example of a semiconductor memory apparatus in accordance with an embodiment.

Referring to FIG. 1, a semiconductor memory apparatus in accordance with an embodiment may include a row address control block 100, a bank control block 200, and a data storage region 300.

The row address control block 100 may generate a row address Row_add, a pre-bank active signal BK_actp and an auto-precharge signal APCG. The row address Row_add, a pre-bank active signal BK_actp and an auto-precharge signal APCG may be generated in response to first and second setting signals MRS_apcg and MRS_aa, a refresh signal REF_s, an address ADD and a bank active signal BK_act. For example, the row address control block 100 may output a counted signal as the row address Row_add in a refresh operation, may output the address ADD stored when the bank active signal BK_act is enabled, as the row address Row_add in the refresh operation, or may output the address ADD as the row address Row_add in a normal operation except the refresh operation, in response to the first and second setting signals MRS_apcg and MRS_aa, the refresh signal REF_s and the bank active signal BK_act. Also, the row address control block 100 may selectively enable the pre-bank active signal BK_actp and the auto-precharge signal APCG in response to the first and second setting signals MRS_apcg and MRS_aa, the refresh signal REF_s and the bank active signal BK_act.

The bank control block 200 may generate the bank active signal BK_act in response to an active signal ACT, a precharge signal PCG, a bank address BKADD, the auto-precharge signal APCG and the pre-bank active signal BK_actp.

The data storage region 300 may be activated in response to the bank active signal BK_act and the row address Row_add. For example, the data storage region 300 may include a plurality of banks (not illustrated). The data storage region 300 may activate a bank corresponding to the bank active signal BK_act. The data storage region 300 may control the word lines of the activated bank in response to the row address Row_add.

Figure 2:
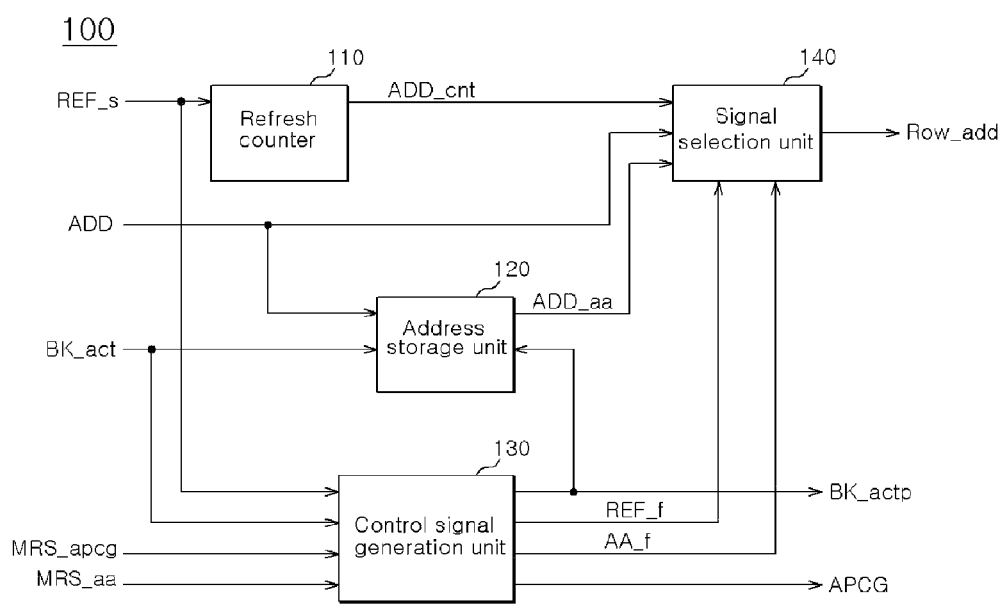
FIG. 2 is a configuration diagram illustrating a representation of an example of the row address control block illustrated in FIG. 1.

Referring to FIG. 2, the row address control block 100 may include a refresh counter 110, an address storage unit 120, and a control signal generation unit 130. The row address control block 100 may include a signal selection unit 140.

The refresh counter 110 may count a counting address ADD_cnt in the refresh operation. For example, the refresh counter 110 may count the counting address ADD_cnt when the refresh signal REF_s is enabled.

The address storage unit 120 may store the address ADD in response to the bank active signal BK_act. The address storage unit 120 may output the stored address as an auto-active address ADD_aa in response to the pre-bank active signal BK_actp. For example, the address storage unit 120 may store the address ADD when the bank active signal BK_act is enabled. For example, the address storage unit 120 may output the stored address as the auto-active address ADD_aa when the pre-bank active signal BK_actp is enabled.

The control signal generation unit 130 may generate the auto-precharge signal APCG, a refresh flag signal REF_f, an auto-active flag signal AA_f and the pre-bank active signal BK_actp. The auto-precharge signal APCG, a refresh flag signal REF_f, an auto-active flag signal AA_f and the pre-bank active signal BK_actp may be generated in response to the refresh signal REF_s, the bank active signal BK_act and the first and second setting signals MRS_apcg and MRS_aa. For example, the control signal generation unit 130 may enable the auto-precharge signal APCG and the refresh flag signal REF_f when the first setting signal MRS_apcg is enabled and the refresh signal REF_s is enabled. The control signal generation unit 130 may enable the auto-active flag signal AA_f in the examples where a predetermined time passes after the refresh flag signal REF_f is enabled when the first and second setting signals MRS_apcg and MRS_aa are enabled and the refresh signal REF_s is enabled. Also, the control signal generation unit 130 may store the information of the bank active signal BK_act in response to the refresh signal REF_s. The control signal generation unit 130 may output the stored information as the pre-bank active signal BK_actp when the refresh flag signal REF_f is enabled.

The signal selection unit 140 may output one of either the counting address ADD_cnt, the address ADD or the auto-active address ADD_aa as the row address Row_add in response to the refresh flag signal REF_f and the auto-active flag signal AA_f. For example, the signal selection unit 140 outputs the address ADD as the row address Row_add when both the refresh flag signal REF_f and the auto-active flag signal AA_f are disabled. The signal selection unit 140 outputs the counting address ADD_cnt as the row address Row_add when the refresh flag signal REF_f is enabled. The signal selection unit 140 outputs the auto-active address ADD_aa as the row address Row_add when the auto-active flag signal AA_f is enabled.

Figure 3:
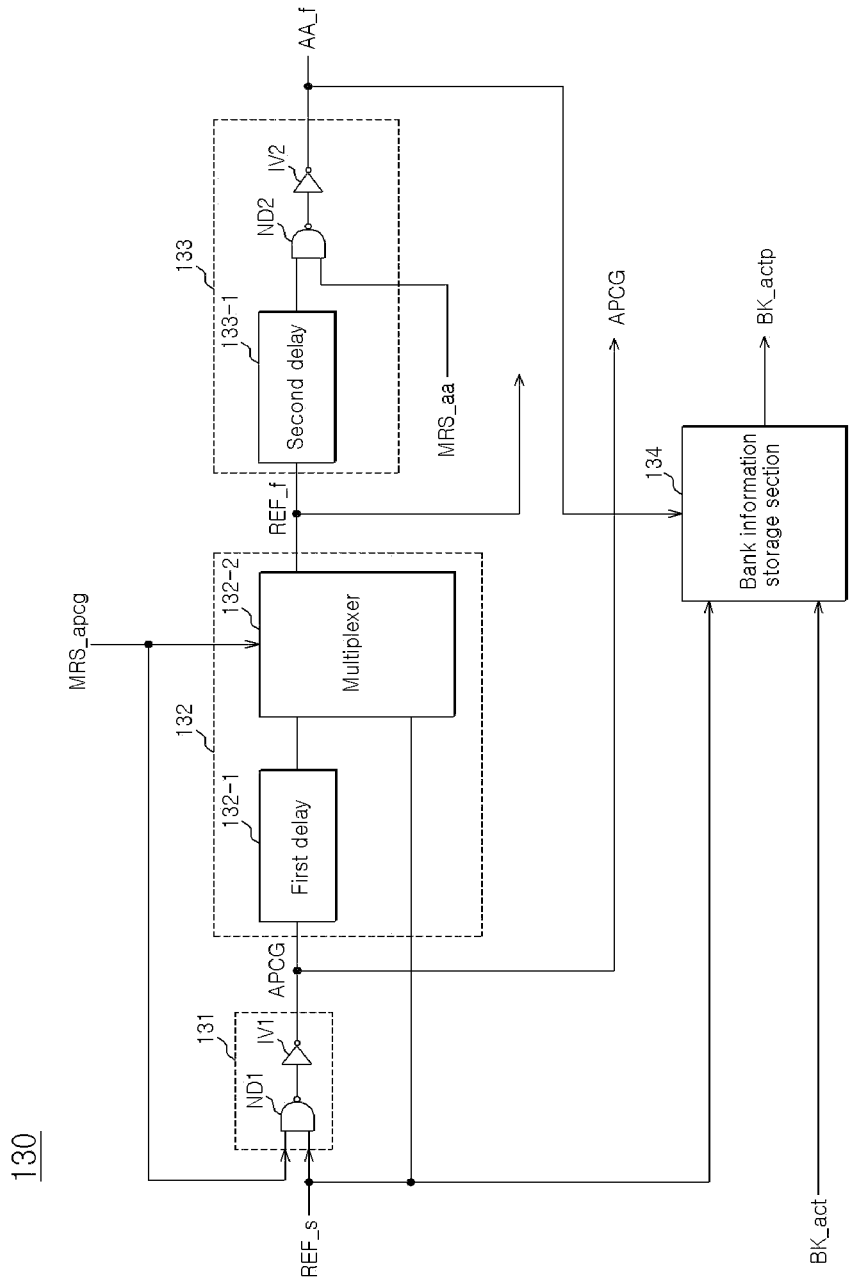
FIG. 3 is a configuration diagram illustrating a representation of an example of the control signal generation unit illustrated in FIG. 2.

Referring to FIG. 3, the control signal generation unit 130 may include an auto-precharge signal generating section 131, and a refresh flag signal generating section 132. The control signal generation unit 130 may include an auto-active flag signal generating section 133, and a bank information storage section 134.

The auto-precharge signal generating section 131 may enable the auto-precharge signal APCG when the first setting signal MRS_apcg is enabled and the refresh signal REF_s is enabled.

The auto-precharge signal generating section 131 may include a first NAND gate ND1 and a first inverter IV1. The first NAND gate ND1 may be inputted with the first setting signal MRS_apcg and the refresh signal REF_s. The first inverter IV1 may be inputted with the output signal of the first NAND gate ND1 and may output the auto-precharge signal APCG.

The refresh flag signal generating section 132 may delay the auto-precharge signal APCG and may output the refresh flag signal REF_f when the first setting signal MRS_apcg is enabled. The refresh flag signal generating section 132 may output the refresh signal REF_s as the refresh flag signal REF_f when the first setting signal MRS_apcg is disabled.

The refresh flag signal generating section 132 may include a first delay 132-1 and a multiplexer 132-2. The first delay 132-1 may delay the auto-precharge signal APCG. The multiplexer 132-2 may output the output signal of the first delay 132-1 as the refresh flag signal REF_f when the first setting signal MRS_apcg is enabled. The multiplexer 132-2 may output the refresh signal REF_s as the refresh flag signal REF_f when the first setting signal MRS_apcg is disabled.

The auto-active flag signal generating section 133 may delay the refresh flag signal REF_f and may output the auto-active flag signal AA_f when the second setting signal MRS_aa is enabled.

The auto-active flag signal generating section 133 may include a second delay 133-1, a second NAND gate ND2, and a second inverter IV2. The second delay 133-1 may delay the refresh flag signal REF_f. The second NAND gate ND2 may be inputted with the output signal of the second delay 133-1 and the second setting signal MRS_aa. The second inverter IV2 may be inputted with the output signal of the second NAND gate ND2, and may output the auto-active flag signal AA_f.

The bank information storage section 134 may store the information of the bank active signal BK_act when the refresh signal REF_s is enabled, and may output the stored information as the pre-bank active signal BK_actp when the auto-active flag signal AA_f is enabled. The bank information storage section 134 may disable the pre-bank active signal BK_actp when the refresh signal REF_s is disabled.

Figure 4:
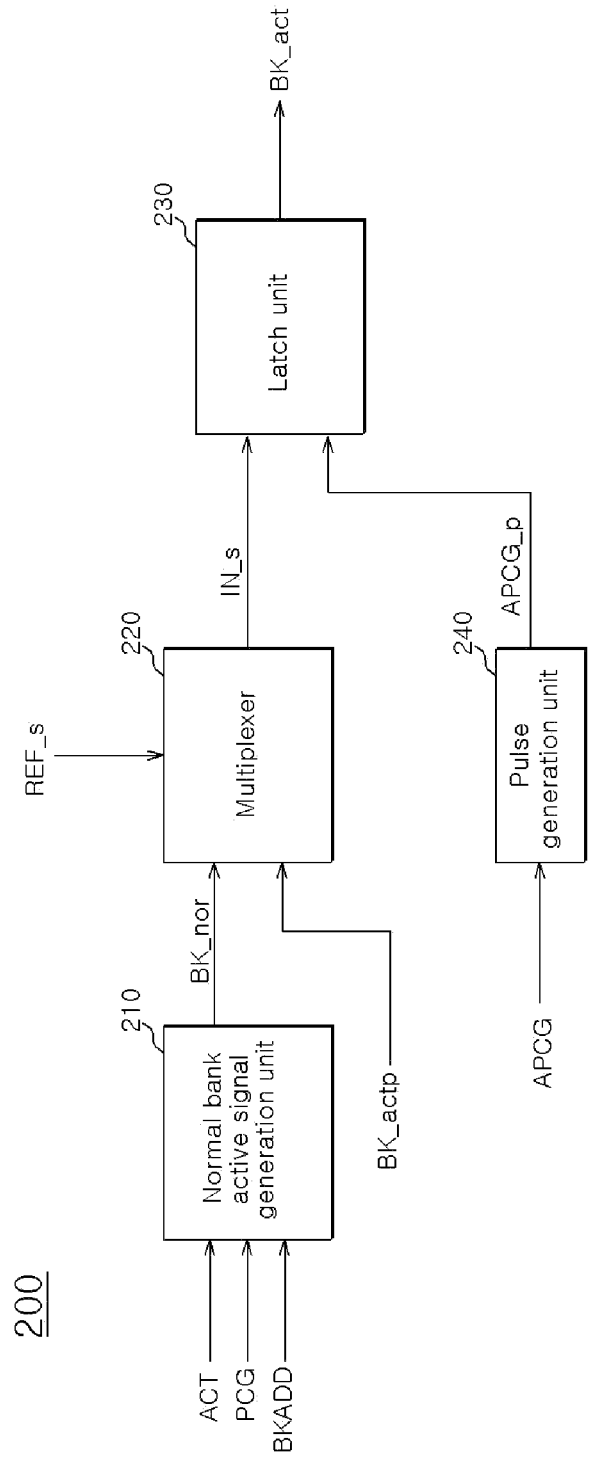
FIG. 4 is a configuration diagram illustrating a representation of an example of the bank control block illustrated in FIG. 1.

Referring to FIG. 4, the bank control block 200 may include a normal bank active signal generation unit 210, a multiplexer 220, and a latch unit 230. The bank control block 200 may include a pulse generation unit 240.

The normal bank active signal generation unit 210 may output the bank address BKADD as a normal bank active signal BK_nor when the active signal ACT is enabled. The normal bank active signal generation unit 210 may disable the normal bank active signal BK_nor when the precharge signal PCG is enabled.

The multiplexer 220 may output one of either the normal bank active signal BK_nor or the pre-bank active signal BK_actp as an input signal IN_s in response to the refresh signal REF_s. For example, the multiplexer 220 may output the pre-bank active signal BK_actp as the input signal IN_s when the refresh signal REF_s is enabled. For example the multiplexer 220 may output the normal bank active signal BK_nor as the input signal IN_s when the refresh signal REF_s is disabled.

The latch unit 230 may output the input signal IN_s as the bank active signal BK_act. Further, the latch unit 230 may disable the bank active signal BK_act during a period in which an auto-precharge pulse APCG_p is enabled. The latch unit 230 may be configured by an S-R latch circuit.

The pulse generation unit 240 may generate the auto-precharge pulse APCG_p. The auto-precharge pulse APCG_p may be enabled for a predetermined time, when the auto-precharge signal APCG is enabled.

Operations of the semiconductor memory apparatus in accordance with the embodiments, configured as mentioned above, will be described below.

The first and second setting signals MRS_apcg and MRS_aa may be signals which are outputted from, for example but not limited to, a mode register set.

The normal operation except the refresh operation will be described first.

In the normal operation, for example, the refresh signal REF_s is disabled.

If the refresh signal REF_s is disabled, the row address control block 100 transmits the address ADD to the data storage region 300 as the row address Row_add, regardless of the first and second setting signals MRS_apcg and MRS_aa.

Operations of the row address control block 100 in the examples where the refresh signal REF_s is disabled will be described below.

Referring to FIG. 3, if the refresh signal REF_s is, for example, disabled, the auto-precharge signal APCG is disabled. Since the refresh flag signal REF_f and the auto-active flag signal AA_f are signals which are generated by delaying the auto-precharge signal APCG, both the refresh flag signal REF_f and the auto-active flag signal AA_f are disabled when the auto-precharge signal APCG is disabled. The bank information storage section 134 disables the pre-bank active signal BK_actp when the refresh signal REF_s is disabled.

Referring to FIG. 2, if both the refresh flag signal REF_f and the auto-active flag signal AA_f are, for example, disabled, the signal selection unit 140 outputs the address ADD as the row address Row_add.

The bank control block 200 generates the bank active signal BK_act in response to the active signal ACT, the precharge signal PCG and the bank address BKADD, since the auto-precharge signal APCG and the pre-bank active signal BK_actp outputted from the row address control block 100 are disabled.

Referring to FIG. 4, the normal bank active signal generation unit 210 generates the normal bank active signal BK_nor in response to the active signal ACT, the precharge signal PCG and the bank address BKADD. The normal bank active signal BK_nor generated in this way is outputted as the bank active signal BK_act through the multiplexer 220 and the latch unit 230.

As a result, not in the refresh operation, that is, in the normal operation, the semiconductor memory apparatus in accordance with an embodiment performs the normal operation by transmitting the address ADD to the data storage region 300 as the row address Row_add and transmitting the bank active signal BK_act generated in response to the active signal ACT, the precharge signal PCG and the bank address BKADD, to the data storage region 300.

Operations in the examples where both the first setting signal MRS_apcg and the second setting signal MRS_aa are enabled in the refresh operation will be described below.

Referring to FIG. 3, if the refresh signal REF_s and the first and second setting signals MRS_apcg and MRS_aa are all, for example, enabled, the auto-precharge signal generating section 131 enables the auto-precharge signal APCG. The refresh flag signal generating section 132 delays the enabled auto-precharge signal APCG, and outputs the refresh flag signal REF_f. The auto-active flag signal generating section 133 delays the enabled refresh flag signal REF_f, and outputs the auto-active flag signal AA_f.

As a result, if the refresh signal REF_s and the first and second setting signals MRS_apcg and MRS_aa are all, for example, enabled, the auto-precharge signal APCG is enabled first, the refresh flag signal REF_f is enabled next, and the auto-active flag signal AA_f is enabled after the refresh flag signal REF_f.

The bank information storage section 134 stores the information of the bank active signal BK_act at the time when the refresh signal REF_s is, for example, enabled, and outputs the stored information as the pre-bank active signal BK_actp when the auto-active flag signal AA_f is, for example, enabled.

Referring to FIG. 2, if the refresh signal REF_s is enabled, the refresh counter 110 counts the counting address ADD_cnt. The address storage unit 120 stores the address ADD at the time when the bank active signal BK_act is, for example, enabled. Thereafter, the address storage unit 120 outputs the stored address as the auto-active address ADD_aa when the pre-bank active signal BK_actp is, for example, enabled.

The signal selection unit 140 outputs the counting address ADD_cnt as the row address Row_add when the refresh flag signal REF_f is, for example, enabled. The signal selection unit 140 outputs the auto-active address ADD_aa as the row address Row_add when both the refresh flag signal REF_f and the auto-active flag signal AA_f are, for example, enabled.

In other words, since the auto-active flag signal AA_f is a signal which is generated by delaying the refresh flag signal REF_f, the auto-active flag signal AA_f is enabled when the predetermined time passes after the refresh flag signal REF_f is enabled. Accordingly, the signal selection unit 140 outputs the auto-active address ADD_aa as the row address Row_add when the predetermined time passes after outputting the counting address ADD_cnt as the row address Row_add, when both the first and second setting signals MRS_apcg and MRS_aa are enabled and the refresh signal REF_s is enabled.

Referring to FIG. 4, the multiplexer 220 outputs the pre-bank active signal BK_actp as the input signal IN_s when the refresh signal REF_s is, for example, enabled. The latch unit 230 disables the bank active signal BK_act for the enable period of the auto-precharge pulse APCG_p, and thereafter, outputs the pre-bank active signal BK_actp as the bank active signal BK_act.

In the refresh operation, the bank control block 200 disables the bank active signal BK_act in response to the auto-precharge signal APCG, and thereafter, outputs the pre-bank active signal BK_actp as the bank active signal BK_act.

The operations of the semiconductor memory apparatus in accordance with an embodiment may be generally summarized, for example, as follows.

If the refresh signal REF_s is enabled in the state in which both the first and second setting signals MRS_apcg and MRS_aa are enabled, the auto-precharge signal APCG is enabled first, the refresh flag signal REF_f is enabled next, and the auto-active flag signal AA_f is enabled after the refresh flag signal REF_f is enabled. The address ADD is stored in the address storage unit 120 by the bank active signal BK_act which is finally enabled before the refresh operation, and in the refresh operation, the bank active signal BK_act is stored in the bank information storage section 134.

If the auto-precharge signal APCG is enabled, as the bank active signal BK_act is disabled, a precharge operation is performed.

Thereafter, if the refresh signal REF_s is enabled, as the counting address ADD_cnt is outputted as the row address Row_add, the refresh operation is performed.

If the auto-active flag signal AA_f is enabled after the refresh operation is completed, that is, after the refresh signal REF_s is enabled, the address and the bank active information stored in the address storage unit 120 and the bank information storage section 134 are outputted as the auto-active address ADD_aa and the pre-bank active signal BK_actp. The auto-active address ADD_aa is outputted as the row address Row_add, and the pre-bank active signal BK_actp is outputted as the bank active signal BK_act.

As a result, if the first and second setting signals MRS_apcg and MRS_aa are, for example, enabled and the refresh signal REF_s is enabled, after the refresh operation (the operation in which the counting address ADD_cnt is outputted as the row address Row_add) is performed, the address ADD and the information of the bank active signal BK_act which are stored before the refresh operation are outputted as the row address Row_add and the bank active signal BK_act, whereby recovery is made to the states of the row address Row_add and the bank active signal BK_act before the refresh operation.

If the refresh operation is performed in a state in which, for example, the first setting signal MRS_apcg is enabled and the second setting signal MRS_aa is disabled, since the bank active signal BK_act is disabled before the refresh operation, only the precharge operation is performed, and recovery is not made to the states of the row address Row_add and the bank active signal BK_act before the refresh operation. This is because the auto-active flag signal AA_f is not enabled but disabled when the second setting signal MRS_aa is disabled. If, for example, the auto-active flag signal AA_f is disabled, the auto-active address ADD_aa is not outputted as the row address Row_add, and the information stored in the bank information storage section 134 is not outputted as the pre-bank active signal BK_actp.

As a consequence, in the semiconductor memory apparatus in accordance with the embodiments, when performing a refresh operation using a plurality of setting signals which may be set in a mode register set, a precharge operation may be performed before the refresh operation even without being inputted with a precharge command from an exterior, and recovery to a bank state before the refresh operation (recovery of the row address Row_add and the bank active signal BK_act) may be made after the refresh operation is completed, whereby the efficiency of the refresh operation may be improved.

The semiconductor memory apparatuses discussed above (see FIGS. 1-4) are particular useful in the design of memory devices, processors, and computer systems. For example, referring to FIG. 7, a block diagram of a system employing the semiconductor memory apparatuses in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor memory apparatus as discussed above with reference to FIGS. 1-4. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor memory apparatus as discussed above with relation to FIGS. 1-4, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

Figure 5:
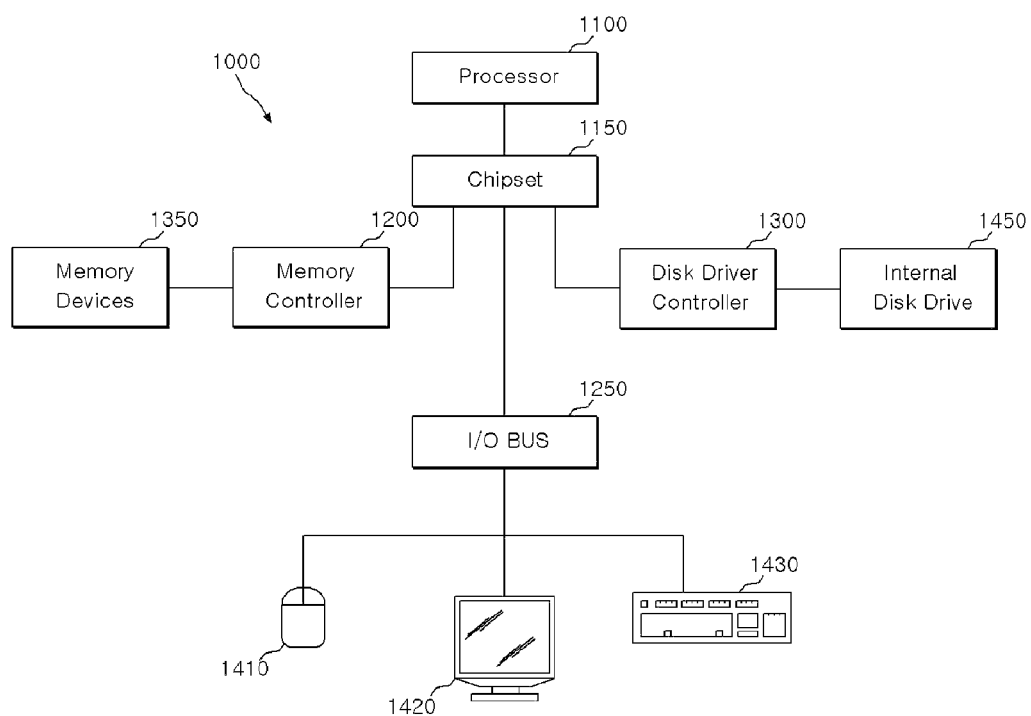
FIG. 5 illustrates a block diagram of an example of a representation of a system employing the semiconductor memory apparatus in accordance with the embodiments discussed above with relation to FIGS. 1-4.

It is important to note that the system 1000 described above in relation to FIG. 5 is merely one example of a system employing the semiconductor memory apparatus as discussed above with relation to FIGS. 1-4. In alternate embodiments, such as cellular phones or digital cameras, the components may differ from the embodiments illustrated in FIG. 5.

While various embodiments have been described above, it will be understood to those skilled in the art that the embodiments described are by way of example only. Accordingly, the semiconductor memory apparatus described herein should not be limited based on the described embodiments.

What is claimed is:

1. A semiconductor memory apparatus comprising:
   a row address control block configured to output an address as a row address or output a counted signal as the row address in response to a refresh signal and the address, and generate an auto-precharge signal and a pre-bank active signal in response to the refresh signal and a bank active signal; and
   a bank control block configured to generate the bank active signal in response to an active signal, a precharge signal, a bank address signal, the auto-precharge signal and the pre-bank active signal.

2. The semiconductor memory apparatus according to claim 1, wherein the row address control block outputs the address as the row address when the refresh signal is disabled, and outputs the counted signal as the row address when the refresh signal is enabled.

3. The semiconductor memory apparatus according to claim 2, wherein the row address control block outputs a counted signal generated when the refresh signal is enabled, stores the address at a time when the bank active signal is enabled and outputs the stored address as the row address in response to a first setting signal, a second setting signal and the bank active signal.

4. The semiconductor memory apparatus according to claim 2, wherein the row address control block outputs the address as the row address in response to a first setting signal, a second setting signal and the bank active signal.

5. The semiconductor memory apparatus according to claim 4, wherein the row address control block comprises:

a refresh counter configured to generate the counted signal in response to the refresh signal;

an address storage unit configured to store the address in response to the bank active signal, and output the stored address as an auto-active address in response to the pre-bank active signal;

a control signal generation unit configured to generate the pre-bank active signal, the auto-precharge signal, a refresh flag signal and an auto-active flag signal in response to the bank active signal, the refresh signal and the first and second setting signals; and a signal selection unit configured to selectively output one of either the counted signal, the auto-active address or the address as the row address in response to the refresh flag signal and the auto-active flag signal.

6. The semiconductor memory apparatus according to claim 5, wherein the address storage unit stores the address when the bank active signal is enabled, and outputs the stored address as the auto-active address when the pre-bank active signal is enabled.

7. The semiconductor memory apparatus according to claim 5, wherein the control signal generation unit outputs the refresh signal as the refresh flag signal when the first and second setting signals are disabled and the refresh signal is enabled.

8. The semiconductor memory apparatus according to claim 7, wherein, when the first setting signal and the refresh signal are enabled and the second setting signal is disabled, the control signal generation unit enables the auto-precharge signal and enables the refresh flag signal when a first predetermined time passes after the auto-precharge signal is enabled.

9. The semiconductor memory apparatus according to claim 8, wherein the control signal generation unit enables the auto-precharge signal when the first and second setting signals and the refresh signal are all enabled, enables the refresh flag signal when the first predetermined time passes after the auto-precharge signal is enabled, enables the auto-active flag signal when a second predetermined time passes after the refresh flag signal is enabled, stores the bank active signal at a time when the refresh signal is enabled, and outputs the stored bank active signal as the pre-bank active signal when the auto-active flag signal is enabled.

10. The semiconductor memory apparatus according to claim 9, wherein the control signal generation unit comprises:
an auto-precharge signal generating section configured to enable the auto-precharge signal when the refresh signal is enabled and the first setting signal is enabled;
a refresh flag signal generating section configured to output a delayed signal of the auto-precharge signal as the refresh flag signal or output the refresh signal as the refresh flag signal, in response to the first setting signal;
an auto-active flag signal generating section configured to delay the refresh flag signal and output the auto-active flag signal, in response to the second setting signal; and
a bank information storage section configured to store the bank active signal when the refresh signal is enabled, and output the stored bank active signal as the pre-bank active signal when the auto-active flag signal is enabled.

11. The semiconductor memory apparatus according to claim 1, wherein the bank control block comprises:
a normal bank active signal generation unit configured to generate a normal bank active signal in response to the active signal, the precharge signal and the bank address;
a multiplexer configured to output one of either the normal bank active signal or the pre-bank active signal as an input signal in response to the refresh signal;
a pulse generation unit configured to generate an auto-precharge pulse in response to the auto-precharge signal; and
a latch unit configured to store the input signal, and output the stored input signal as the bank active signal.

12. The semiconductor memory apparatus according to claim 11, wherein the latch unit is configured to disable the bank active signal in response to the auto-precharge pulse.

13. The semiconductor memory apparatus according to claim 12, wherein the latch unit comprises an S-R latch circuit.

14. A semiconductor memory apparatus comprising:
a row address control block configured to generate a row address, an auto-precharge signal and a pre-bank active signal in response to a refresh signal, an address and a bank active signal;
a bank control block configured to generate the bank active signal in response to an active signal, a precharge signal, a bank address, the auto-precharge signal and the pre-bank active signal; and
a data storage region configured to be activated or perform a refresh operation in response to the row address and the bank active signal,
wherein a precharge operation is performed in response to the auto-precharge signal when the refresh signal is enabled, the refresh operation is performed in response to the pre-bank active signal and the refresh signal after the precharge operation is performed, and recovery to a state before the refresh operation is made after the refresh operation is performed.

15. The semiconductor memory apparatus according to claim 14,
wherein the precharge operation is an operation performed when the bank active signal is disabled,
wherein the refresh operation is an operation for outputting a counted signal as the row address, and
wherein the recovery to the state before the refresh operation is recovery to states of the row address and the bank address before the refresh operation.

16. The semiconductor memory apparatus according to claim 15, wherein the row address control block comprises:
a refresh counter configured to generate a counting address when the refresh signal is enabled;
an address storage unit configured to store the address when the bank active signal is enabled, and output the stored address as an auto-active address when the pre-bank active signal is enabled;
a signal selection unit configured to output one of either the counting address, the auto-active address or the address as the row address in response to a refresh flag signal and an auto-active flag signal; and
a control signal generation unit configured to generate the auto-precharge signal, the refresh flag signal, the auto-active flag signal and the pre-bank active signal in response to the refresh signal and the bank active signal.

17. The semiconductor memory apparatus according to claim 16, wherein the control signal generation unit comprises:
an auto-precharge signal generating section configured to enable the auto-precharge signal when the refresh signal is enabled;
a refresh flag signal generating section configured to delay the auto-precharge signal and generate the refresh flag signal;
an auto-active flag signal generating section configured to delay the refresh flag signal and output the auto-active flag signal; and a bank information storage section configured to store the bank active signal when the refresh signal is enabled, and output the stored bank active signal as the pre-bank active signal when the auto-active flag signal is enabled.

18. The semiconductor memory apparatus according to claim 14, wherein the bank control block comprises:
a normal bank active signal generation unit configured to output the bank address as a normal bank active signal when the active signal is enabled, and disable the normal bank active signal when the precharge signal is enabled;
a multiplexer configured to output one of either the normal bank active signal or the pre-bank active signal as an input signal in response to the refresh signal;
a pulse generation unit configured to generate an auto-precharge pulse in response to the auto-precharge signal; and
a latch unit configured to latch the input signal and output the bank active signal, and disable the bank active signal when the auto-precharge pulse is inputted.

* * * * *